(12) United States Patent
Feng et al.

(10) Patent No.: US 11,049,863 B2
(45) Date of Patent: Jun. 29, 2021

(54) SEMICONDUCTOR STRUCTURE WITH CAPACITOR LANDING PAD AND METHOD OF MAKING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Li-Wei Feng, Kaohsiung (TW); Shih-Fang Tzou, Tainan (TW); Chien-Ting Ho, Taichung (TW); Ying-Chiao Wang, Changhua County (TW); Yu-Ching Chen, Kaohsiung (TW); Hui-Ling Chuang, Changhua County (TW); Kuei-Hsuan Yu, New Taipei (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 15/889,182

(22) Filed: Feb. 5, 2018

(65) Prior Publication Data
US 2018/0247943 A1 Aug. 30, 2018

(30) Foreign Application Priority Data
Feb. 24, 2017 (CN) .......................... 201710102423.8

(51) Int. Cl.
*H01L 27/108* (2006.01)

(52) U.S. Cl.
CPC .. *H01L 27/10855* (2013.01); *H01L 27/10814* (2013.01); *H01L 27/10823* (2013.01)

(58) Field of Classification Search
CPC .................................................. H01L 27/10823
See application file for complete search history.

(56) References Cited

U.S. PATENT DOCUMENTS

| 2008/0014736 | A1 | 1/2008 | Kawakita | |
| 2013/0134435 | A1* | 5/2013 | Yu | H01L 29/42316 257/76 |
| 2013/0196477 | A1* | 8/2013 | Kang | H01L 27/10876 438/270 |
| 2015/0126013 | A1* | 5/2015 | Hwang | H01L 27/10888 438/381 |
| 2015/0214146 | A1* | 7/2015 | Kim | H01L 27/10855 257/741 |
| 2016/0358850 | A1* | 12/2016 | Park | H01L 24/02 |

FOREIGN PATENT DOCUMENTS

CN 102479803 A 5/2012

* cited by examiner

*Primary Examiner* — Omar F Mojaddedi
(74) *Attorney, Agent, or Firm* — Winston Hsu

(57) ABSTRACT

A semiconductor structure with a capacitor landing pad includes a substrate. A capacitor contact plug is disposed on the substrate. A capacitor landing pad contacts and electrically connects the capacitor contact plug. A bit line is disposed on the substrate. A dielectric layer surrounds the capacitor landing pad. The dielectric layer includes a bottom surface lower than a top surface of the bit line.

5 Claims, 20 Drawing Sheets

SEMICONDUCTOR STRUCTURE WITH CAPACITOR LANDING PAD AND METHOD OF MAKING THE SAME

BACKGROUND OF THE INVENTION

1. Field of the Invention

The present invention relates to a fabricating method of a capacitor landing pad, and more particularly to a fabricating method which reduces the possibility of a short circuit in the capacitor landing pad.

2. Description of the Prior Art

The dynamic random access memory (DRAM) comprises a MOS transistor, a capacitor and a contact plug. The MOS transistor is used for transferring electric charge, the capacitor is used for storing the charge to memorize information, and the contact plug is used as a node contact to electrically connect the MOS transistor and the capacitor.

As devices of the semiconductor become smaller, the process for forming a contact hole to define the position of the contact plug becomes more difficult. Therefore, a landing pad is formed on the contact plug to ensure the connection between the contact plug and the capacitor.

As the DRAM is scaled down, however, a photo mask cannot align precisely during the step of fabricating the landing pad. Therefore, the adjacent landing pads connect to each other after a lithographic process, which causes a short circuit.

SUMMARY OF THE INVENTION

According to a preferred embodiment of the present invention, a semiconductor structure with capacitor landing pads includes a substrate. A capacitor contact plug is disposed on the substrate. A capacitor landing pad contacts and electrically connects the capacitor contact plug. A bit line is disposed on the substrate. A dielectric layer surrounds the capacitor landing pad, wherein the dielectric layer includes a bottom surface lower than a top surface of the bit line.

According to another preferred embodiment of the present invention, a fabricating method of a capacitor landing pad includes providing a substrate, wherein a plurality of word lines are embedded in the substrate, a plurality of insulating layers are disposed on the word lines, each of the insulating layers is respectively disposed directly on one of the word lines, and an opening is defined between the insulating layers adjacent to each other. Next, a metal layer is formed to fill in the opening, wherein the insulating layers are entirely embedded in the metal layer. Then, a first hard mask is formed to cover the metal layer. Subsequently, a first pattern process is performed to transform the first hard mask into a plurality of second hard masks by patterning the first hard mask. Later, a second pattern process is performed to transform the second hard masks into a plurality of third hard masks by patterning the second hard masks, wherein each of the third hard masks does not connect to another third hard mask, and each of the third hard masks partly overlaps one of the insulating layers. After that, the metal layer is removed by taking the third hard masks as a mask to form a trench in the metal layer, wherein the trench extends into the opening, a bottom of the trench is lower than a top surface of the insulating layers, and the trench defines the capacitor landing pad on the metal layer. Finally, a dielectric layer is formed to fill up the trench.

According to yet another preferred embodiment, a contact structure utilized for electrically connecting a capacitor and a transistor in a DRAM includes a capacitor landing pad including a first element and a second element. The first element includes a first bottom. A second element includes a first top surface and a second bottom, wherein the first bottom contacts the first top surface, and an area of the first bottom is smaller than an area of the first top surface. A capacitor contact plug is disposed below the capacitor landing pad. The second element is disposed between the first element and the capacitor contact plug, the capacitor contact plug comprises a second top surface, the second top surface contacts the second bottom, and an area of the second top surface is smaller than an area of the second bottom.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 12 depict a semiconductor structure with capacitor landing pads according to a preferred embodiment of the present invention, wherein:

FIG. 1 depicts a fabricating step of providing a substrate and forming a metal layer;

FIG. 2 depicts a fabricating step following FIG. 1;

FIG. 3 depicts a top view of a memory region shown in FIG. 2;

FIG. 4 depicts a fabricating step following FIG. 2;

FIG. 5 depicts a fabricating step following FIG. 4;

FIG. 6 depicts a top view of a memory region shown in FIG. 5;

FIG. 7 depicts a fabricating step following FIG. 5;

FIG. 8 depicts a top view of a memory region shown in FIG. 7;

FIG. 9 depicts a sectional view taken along the line AA' shown in FIG. 8;

FIG. 10 depicts a top view of a memory region shown in FIG. 8;

FIG. 11 depicts a sectional view taken along the line BB' shown in FIG. 10; and

FIG. 12 depicts a sectional view taken along the line CC' shown in FIG. 10.

FIG. 13 to FIG. 18 depict a contact structure utilized for electrically connecting a capacitor and a transistor in a DRAM, wherein:

FIG. 13 depicts a fabricating step of providing a substrate and forming a contact plug;

FIG. 14 depicts a fabricating step following FIG. 13;

FIG. 15 depicts a fabricating step following FIG. 14;

FIG. 16 depicts a fabricating step following FIG. 15;

FIG. 17 depicts a fabricating step following FIG. 16;

FIG. 18 depicts a fabricating step following FIG. 17;

DETAILED DESCRIPTION

Figure 1:
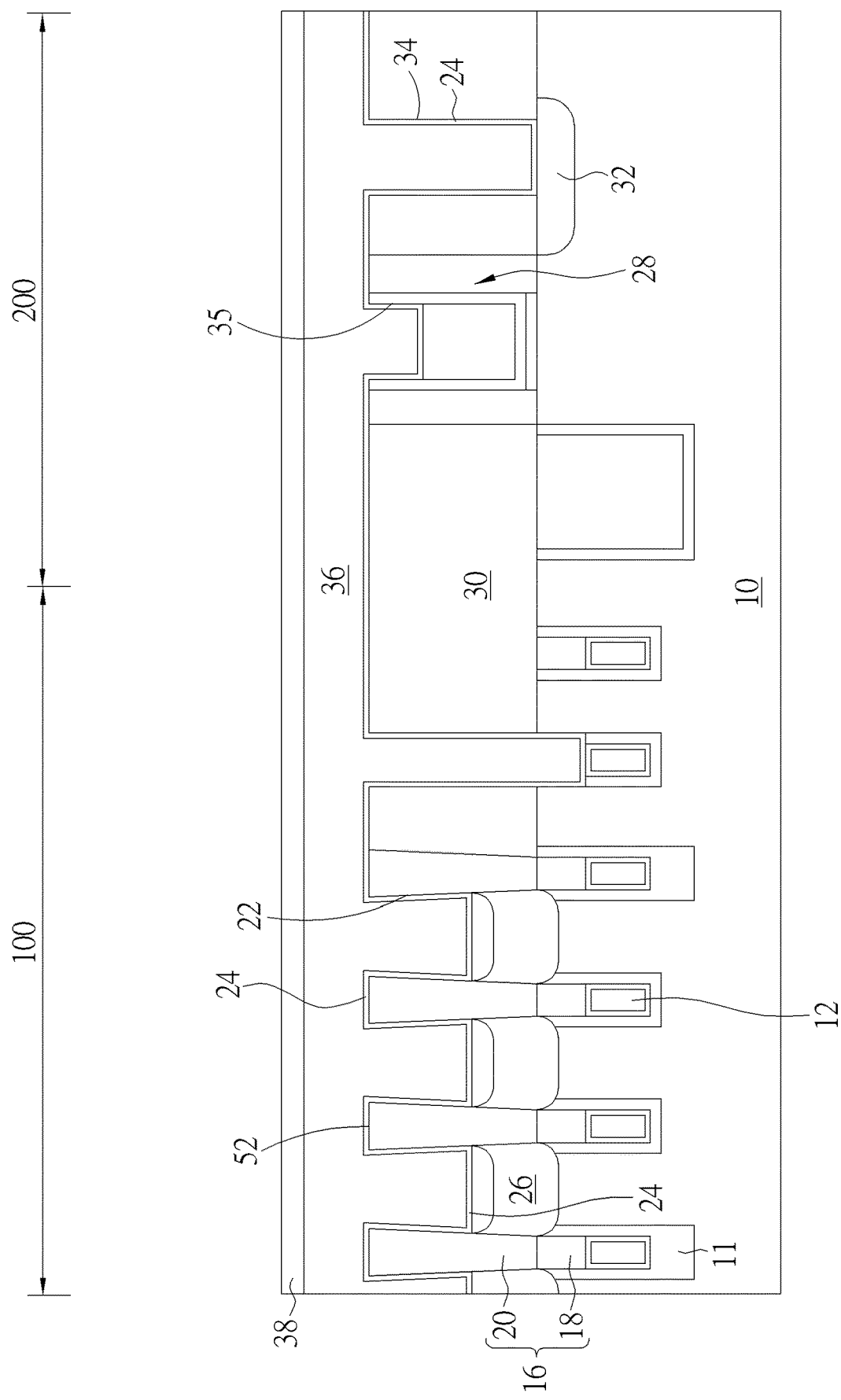

As shown in FIG. 1, a substrate 10 is provided. The substrate 10 has a memory region 100. Numerous active areas (not shown) and numerous shallow trench isolations (STIs) 11 are disposed within the memory region 100. Numerous word lines 12 are embedded in the substrate 10. Several word lines 12 pass the STIs 11. Numerous bit lines (not shown) are disposed on the substrate 10, and each of the bit lines intersects with each of the word lines 12. Moreover, an insulating layer 16 is disposed directly on each of the word lines 12, thereby forming a plurality of insulting layers 16. Each of the insulating layers 16 may include a word line mask 18 and an interlayer dielectric 20. The insulting layer 16 may be a single-layered material or a multiple-layered material. The insulating layers 16 may be silicon oxide, silicon nitride or silicon oxynitride. An opening 22 is defined between each of the insulating layers 16. A conductive layer 24 is formed conformally on the insulating layers 16 and the opening 22. An epitaxial layer 26 is optionally formed on the substrate 10 between two adjacent word lines 12. A doping region (not shown) can be disposed within the substrate 10 directly below the epitaxial layer 26. The opening 22 is directly on the epitaxial layer 26. The substrate 10 may further include a peripheral circuit region 200. A transistor 28 such as a planar transistor is disposed within the peripheral circuit region 200. An opening 35 is disposed on a gate of the transistor 28. A dielectric layer 30 within the peripheral circuit region 200 covers the substrate 10. An opening 34 is disposed in the dielectric layer 30 on the source/drain doping region 32. The conductive layer 24 covers an inner sidewall of the opening 34.

Then, a metal layer 36 is formed to fill in the opening 22, the opening 34 and the opening 35, so that all insulating layers 16 are entirely embedded in the metal layer 36. A top surface of the metal layer 36 is higher than a top surface 52 of the insulating layers 16. Later, a first hard mask 38 is formed to cover the metal layer 36.

Figure 2:
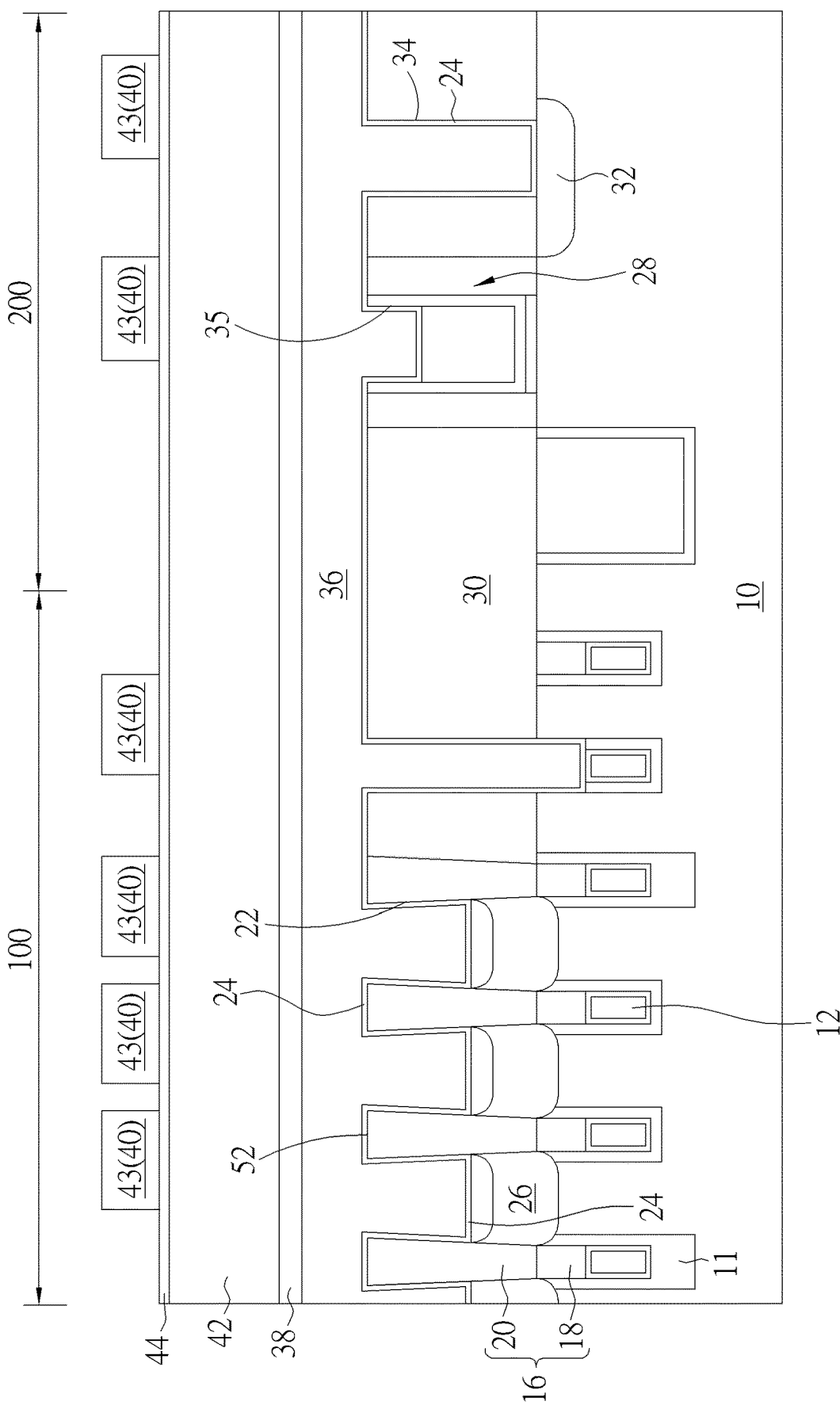
Figure 3:
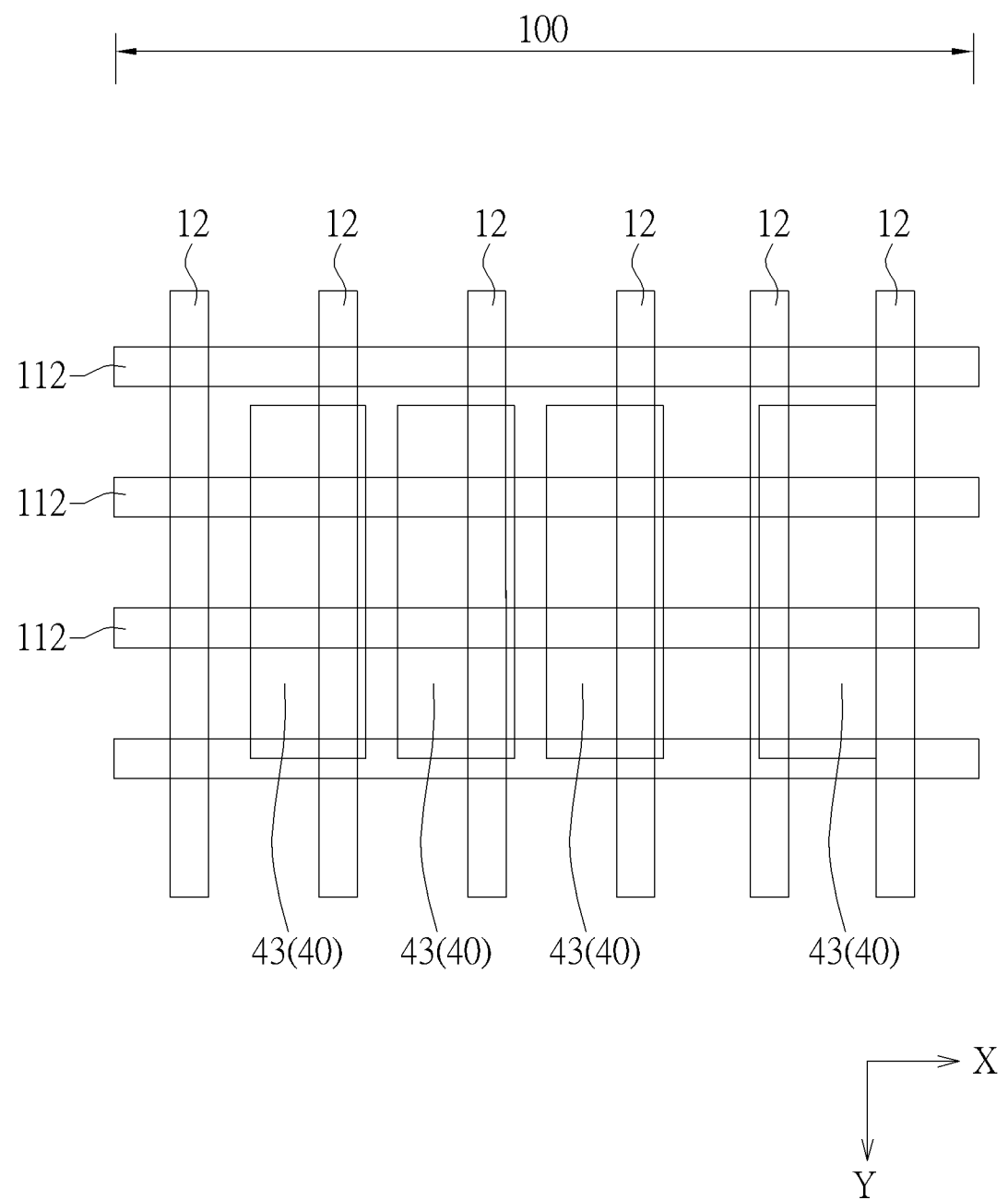

As shown in FIG. 2, a first pattern process is performed. In the first pattern process, a first photoresist 40 is formed to cover the first hard mask 38. An organic dielectric layer (ODL) 42 and a silicon-containing hard mask bottom anti-reflection coating (SHB) 44 are formed between the first photoresist 40 and the first hard mask 38 from bottom to top. Next, the first photoresist 40 is patterned. FIG. 3 is a top view of the memory region 100 shown in FIG. 2. For the sake of brevity, only word lines, bit lines and the patterned first photoresist are shown in FIG. 3. Refer to FIG. 2 together with FIG. 3. Numerous word lines 12 intersect numerous bit lines 112. The patterned first photoresist 40 includes at least one first rectangular pattern 43. Numerous first rectangular patterns 43 are shown in this embodiment. Each of the first rectangular patterns 43 is parallel to each of the word lines 12. It should be noted that a photo mask shifts during an exposure process. In this embodiment, the photo mask shifts in a horizontal direction X. The horizontal direction X is parallel to the bit lines 112. Accordingly, each of the first rectangular patterns 43 covers a corresponding opening 22 and the insulating layer 16 adjacent to the corresponding opening 22. Based on the shift amount of the photo mask, the first rectangular patterns 43 may cover part of the opening 22 and the insulating layer 16 adjacent to the opening 22. In another embodiment, when the photo mask shifts, the first rectangular patterns 43 may only cover part of the insulating layer 16 and cover a greater part of the opening 22. Because the photo mask shifts in a random direction, the photo mask may shift in a vertical direction Y. The vertical direction Y is parallel to the word lines 12. In yet another embodiment, the photo mask may align correctly without any shift.

Figure 4:
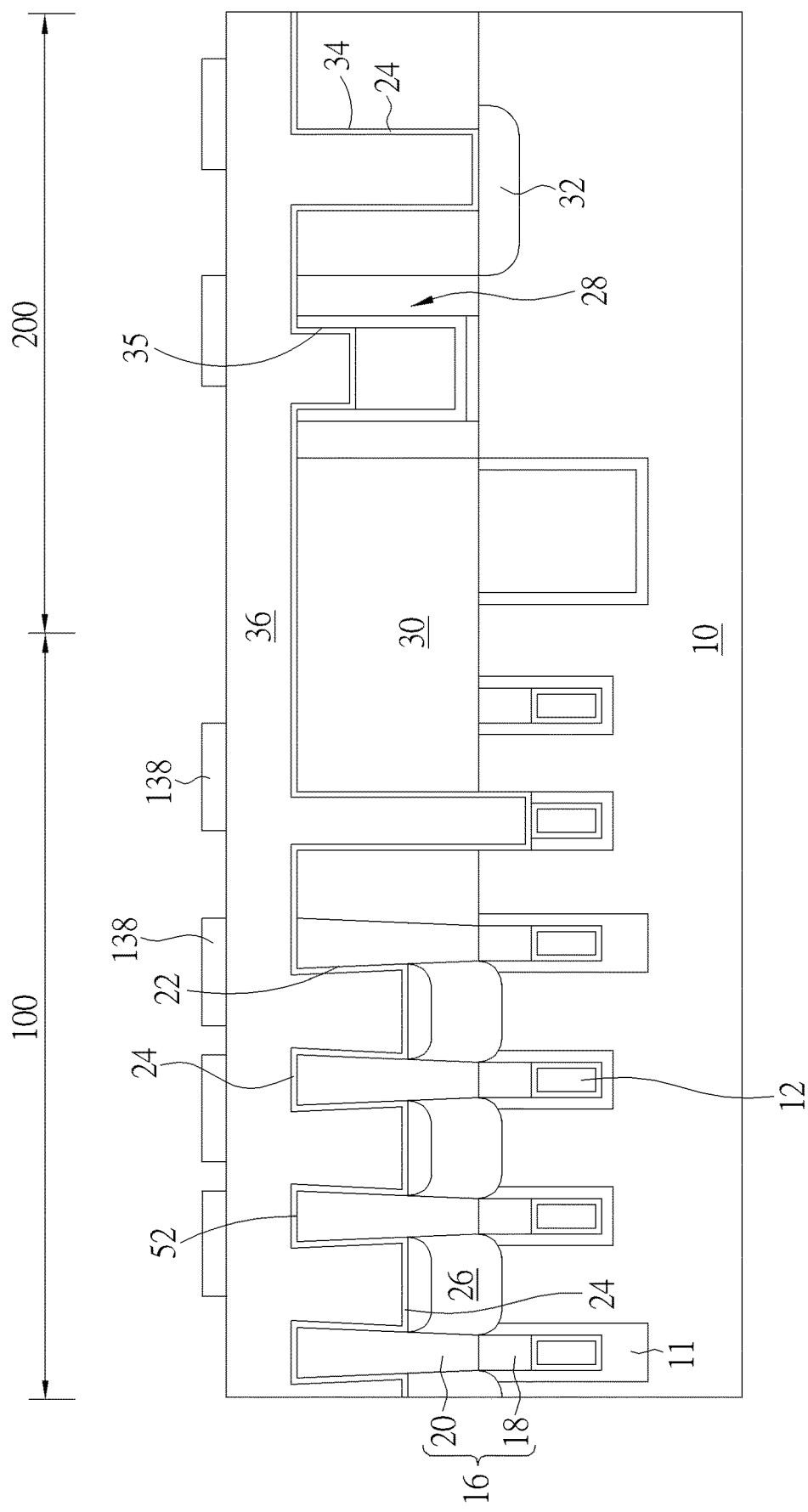

As shown in FIG. 4, all the first rectangular patterns 43 are transferred to the SHB 44 and the ODL 42. Then, the first photoresist 40 is removed. Later, the pattern on the SHB 44 and on the ODL 42 is transferred to a first hard mask 38 to transform the first hard mask 38 into numerous second hard masks 138. Subsequently, the SHB 44 and the ODL 42 are removed. Each of the second hard masks 138 is a rectangular shape. Each of the second hard masks 138 corresponds to a position of a single first rectangular pattern 43. Therefore, each of the second hard masks 138 covers one opening 22 and the insulating layer 16 adjacent to the opening 22 in the memory region 100. In this embodiment, each of the second hard masks 138 simultaneously covers part of the opening 22 and covers the entire insulating layer 16 adjacent to the opening 22.

Figure 5:
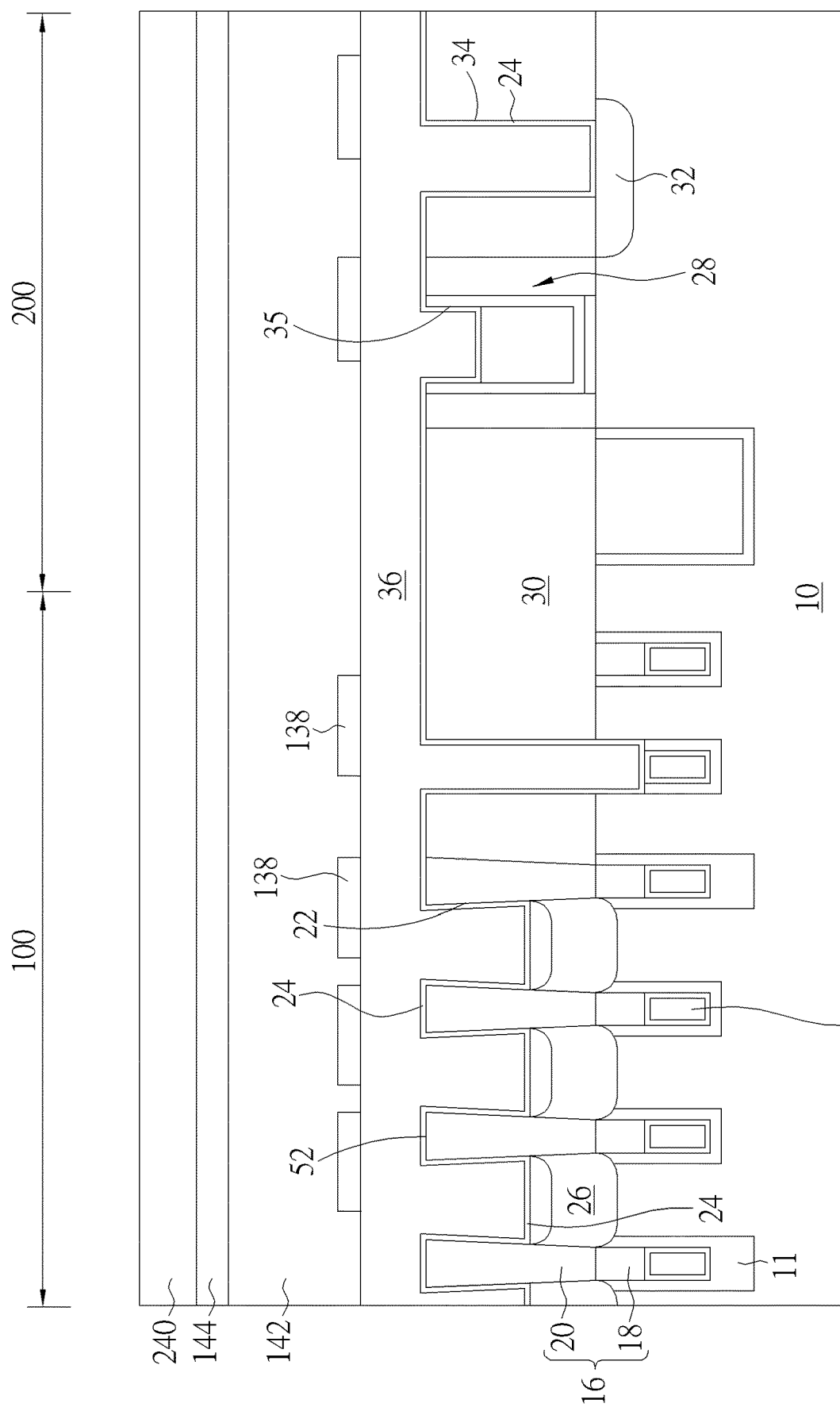
Figure 6:
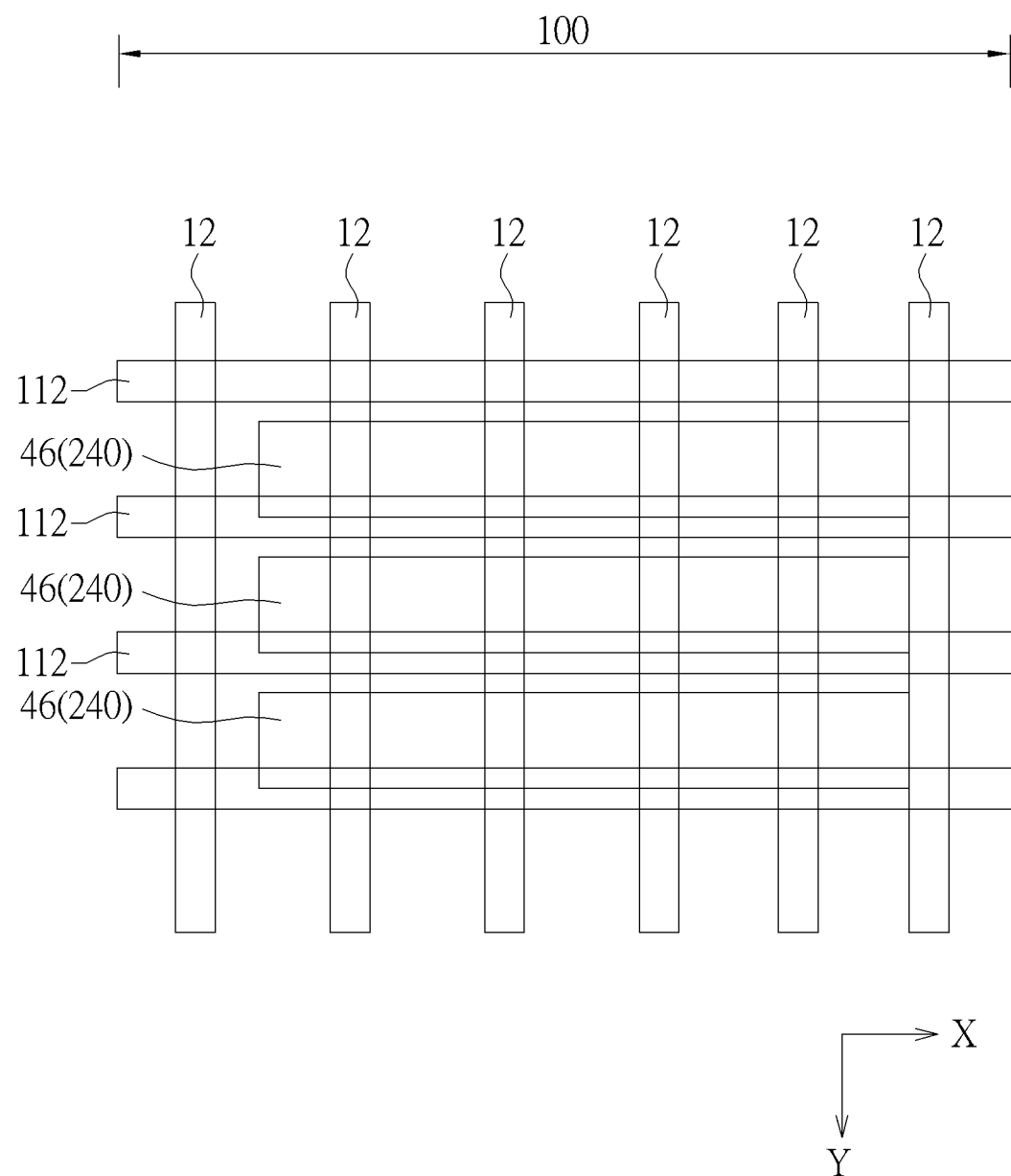

As shown in FIG. 5, a second pattern process is performed to form a second photoresist 240 which covers the second hard masks 138. An ODL 142 and an SHB 144 can be formed from bottom to top between the second photoresist 240 and the second hard masks 138. FIG. 6 depicts a top view of a memory region in FIG. 5. For the sake of brevity, only word lines, bit lines and the patterned second photoresist are shown in FIG. 6. As shown in FIG. 5, the patterned second photoresist 240 includes at least one second rectangular pattern 46. Numerous second rectangular patterns 46 are shown in this embodiment as an example. The second rectangular patterns 46 are parallel to the bit lines 112. As before, the photo mask may shift during an exposure process, and the photo mask shifts in a random direction. Therefore, the photo mask may shift in a vertical direction Y or in a horizontal direction Z. In one embodiment, the photo mask does not shift. In this embodiment, the photo mask shift in the vertical direction Y. Refer to FIG. 3 together with FIG. 6, each of the second rectangular patterns 46 intersects each of the first rectangular patterns 43. The position where the second rectangular patterns 46 overlaps the first rectangular patterns 43 defines a position of a capacitor landing pad on the metal layer 36.

Figure 7:
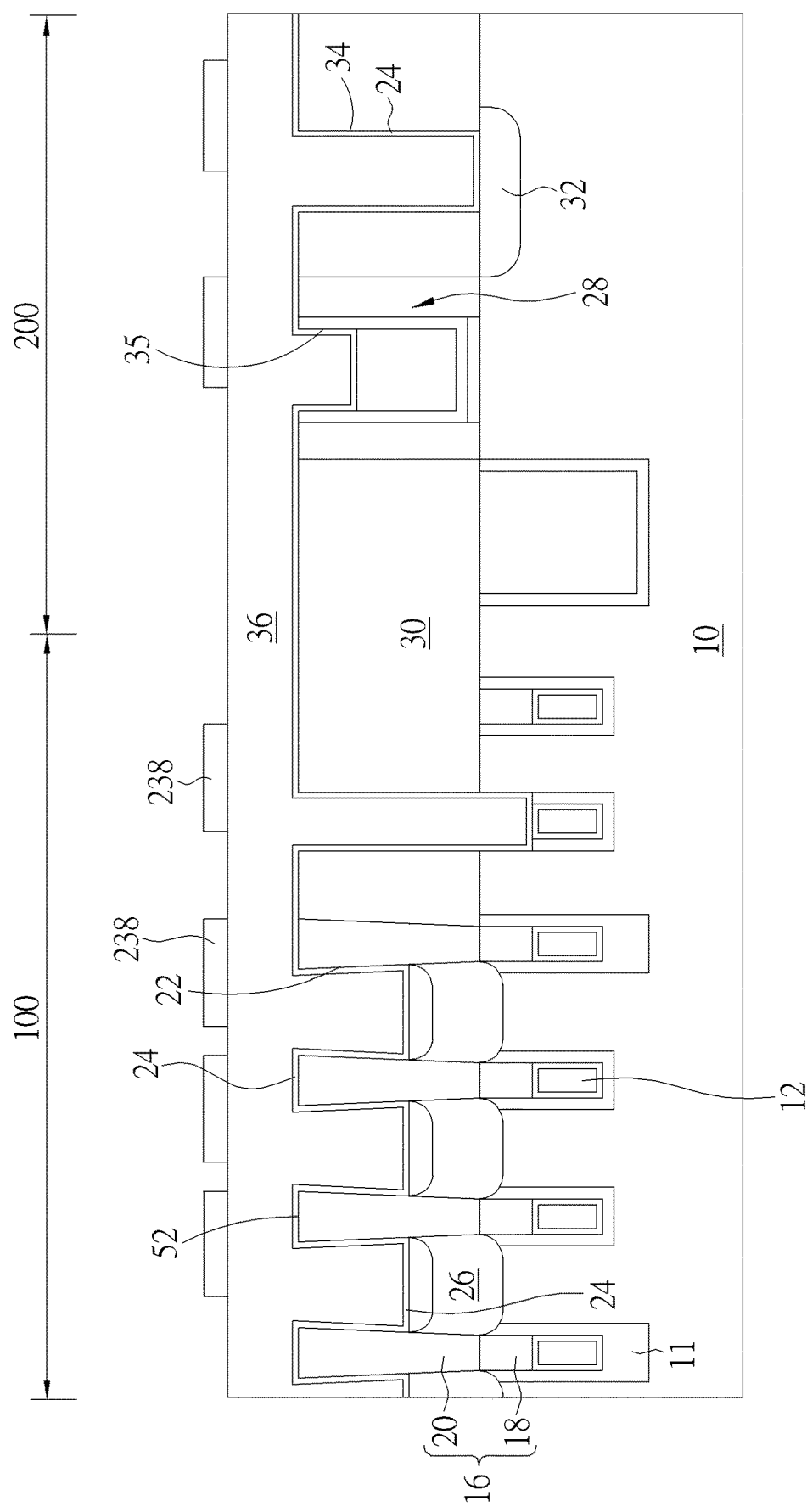

As shown in FIG. 7, the pattern on the second rectangular patterns 46 is transferred onto the SHB 144 and the ODL 142. Next, the second photoresist 240 is removed. Then, the pattern on the SHB 144 and on the ODL 142 is transferred to the second hard masks 138. At this point, the second hard masks 138 overlapping the second rectangular pattern 46 remains, and the second hard masks 138 are transformed into numerous third hard masks 238. In the memory region 100, the third hard masks 238 will define the position of the capacitor landing pad. Each of the third hard masks 238 does not connect to another third hard mask, and each of the third hard masks 238 overlaps one insulating layer 16. In this embodiment, one of the third hard masks 238 overlaps part of the opening 22 and overlaps one entire insulating layer 16.

Figure 8:
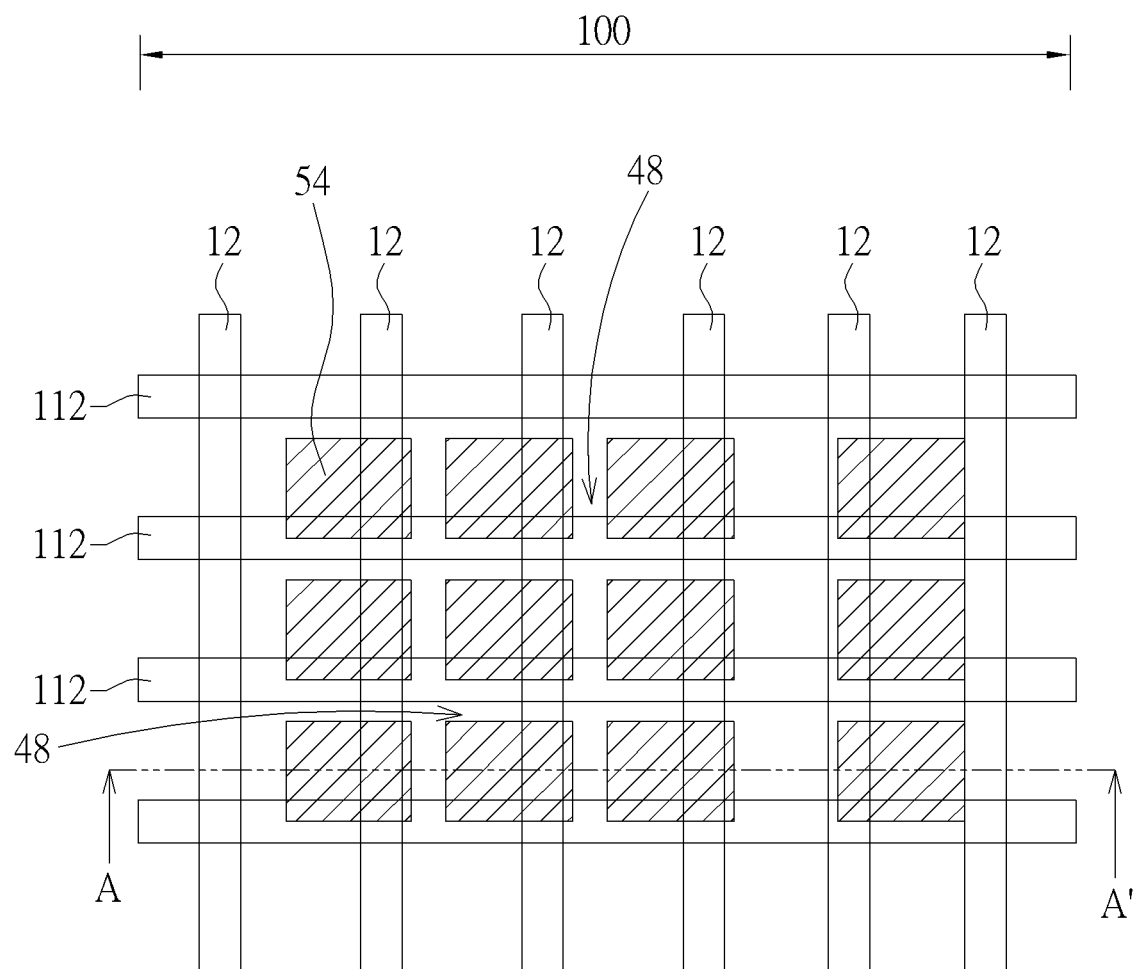
Figure 9:
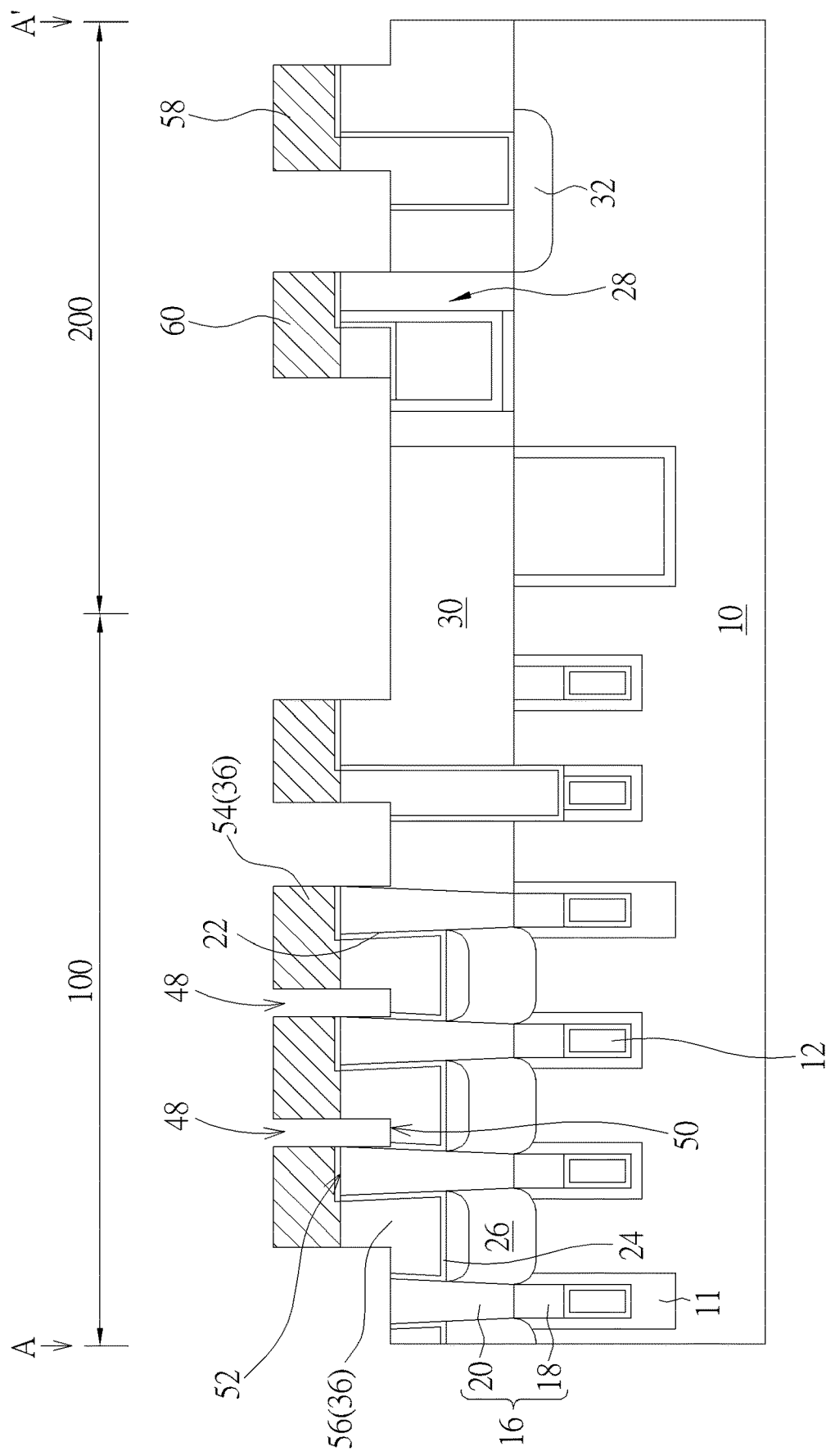

FIG. 8 is a top view following FIG. 7. FIG. 9 is a sectional view taken along line AA' shown in FIG. 8. For the sake of brevity, only word lines, bit lines and the capacitor landing pads are shown in FIG. 8. Refer to FIG. 8 together with FIG. 9. At least one trench 48 is formed by removing the metal layer 36 by taking the third hard masks 238 as a mask. The trench 48 extends into the opening 22. A bottom 50 of the trench 48 is lower than a top surface 52 of the insulating layer 16. Then, the third hard masks 238 are removed.

In another embodiment, under the situation where each of the third hard masks 238 only overlaps part of each of the insulating layers 16, that part of each of the insulating layers 16 will be removed during the formation of the trench 48. The space formed after removing the insulating layers 16 becomes a part of the trench 48. This embodiment takes the third hard masks 238 as entirely overlapping the insulating layers 16 as an example. After removing part of the metal layer 36, the remaining metal layer 36 on the top surface 52 of each of the insulating layers 16 serves as a capacitor landing pad 54. The trench 48 therefore defines the position of the capacitor landing pad 54 on the metal layer 36. There are numerous capacitor landing pads 54 in this embodiment. The capacitor landing pads 54 are illustrated in the diagram by reverse slashes. The metal layer 36 inside the opening 22 and below the top surface of the insulating layer 16 serves as capacitor contact plugs 56. As mentioned above, the photo mask often shifts during alignment; therefore, the present invention makes the bottom 50 of the trench 48 lower than the top surface 52 of the insulating layer 16 to ensure the capacitor landing pads 54 do not contact each other. Furthermore, the trench 48 forms a chessboard pattern within the memory region 100. The trench 48 is parallel to bit lines 112 and word lines 12. The trench 48 is also perpendicular to the bit lines 112 and word lines 12. Moreover, the remaining metal layer 25 in the peripheral circuit region 200 serves as a source/drain conductive pad 58 and a gate landing pad 60.

Figure 10:
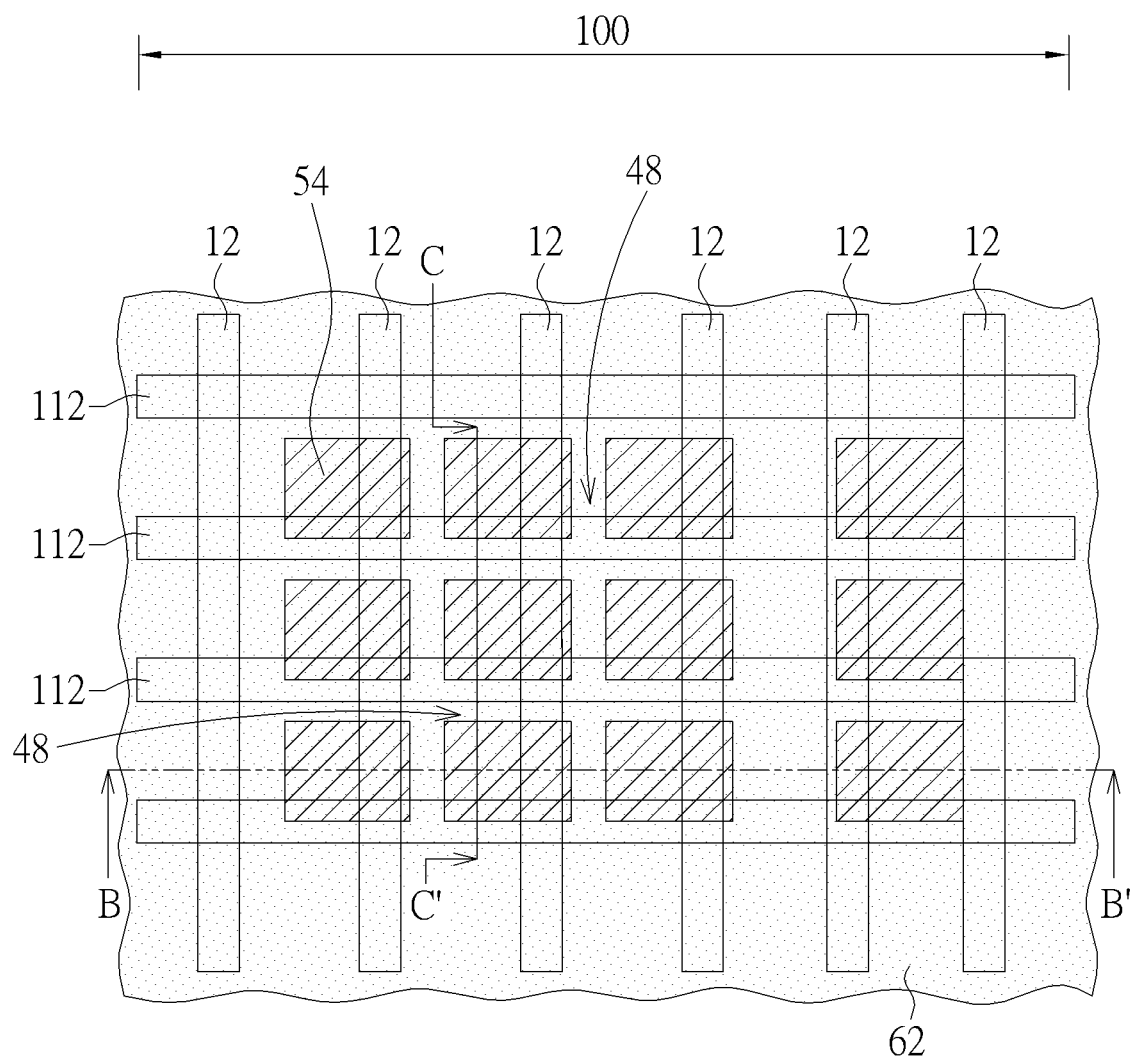
Figure 11:
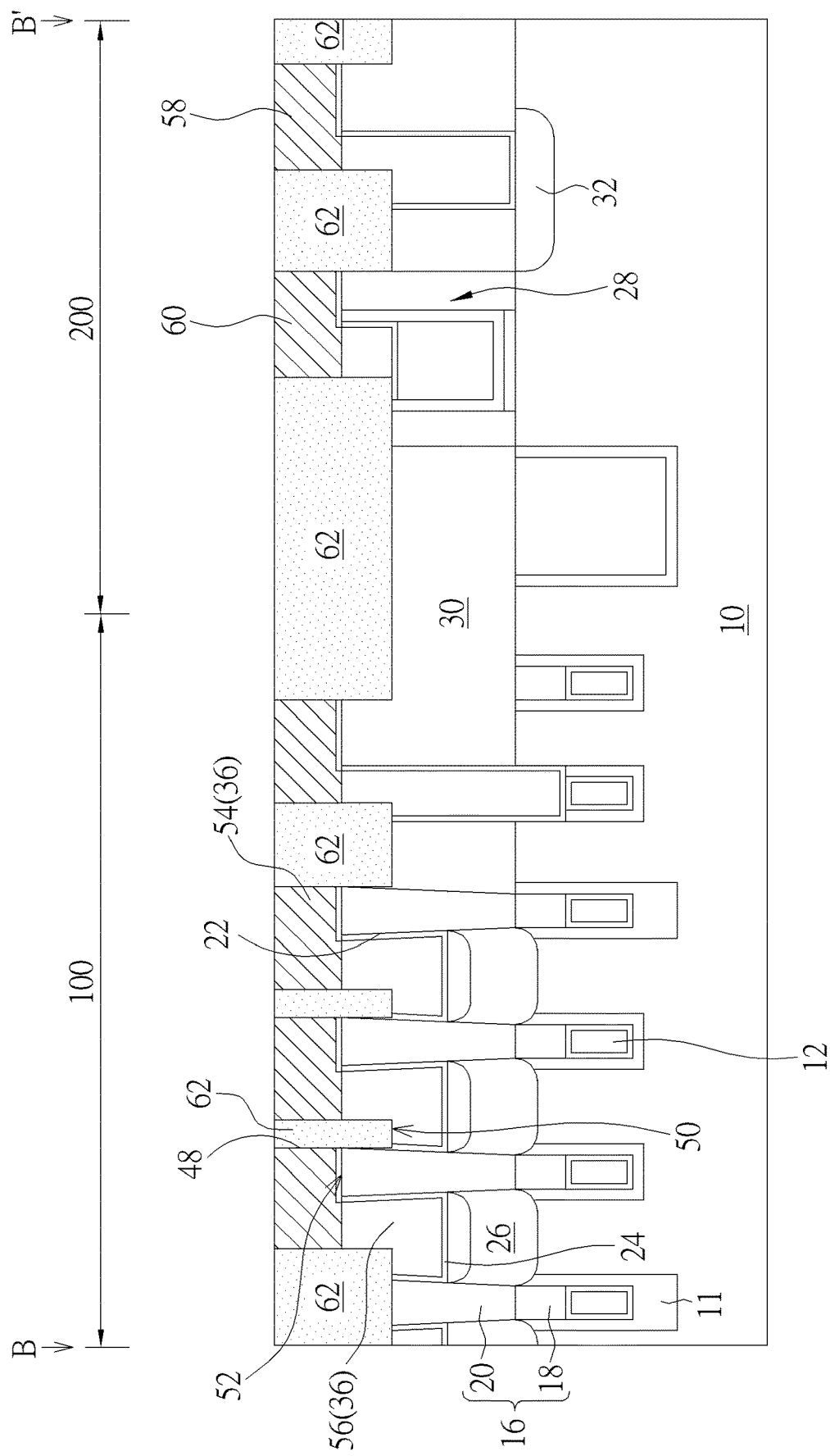
Figure 12:
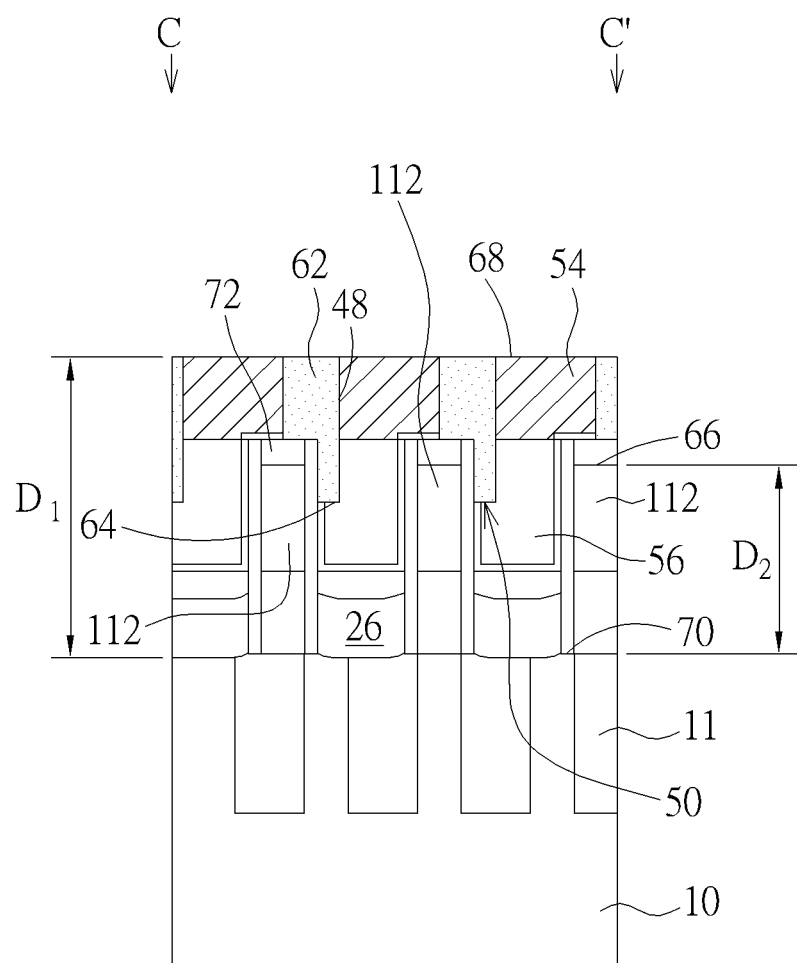

FIG. 10 is a top view following FIG. 8. FIG. 11 is a sectional view taken along the line BB' shown in FIG. 10. FIG. 12 is a sectional view taken along the line CC' shown in FIG. 10. For the sake of brevity, only word lines, bit lines, capacitor lading pads, and a dielectric layer are shown in FIG. 10. Refer to FIG. 10 together with FIG. 11. A dielectric layer 62 is formed on the substrate 10. The dielectric layer 62 within the memory region 100 forms a chessboard, and the dielectric layer 62 fills in the trench 48 between the capacitor landing pads 54. After that, a capacitor (not shown) can be formed on the capacitor landing pads 54. At this point, the transistors formed by the word lines 12 can form a dynamic random access memory (DRAM) with a capacitor. It should be noted that a bottom 64 of the dielectric layer 62 is lower than the top surface 52 of the insulating layer 16. Moreover, as shown in FIG. 12, the bottom 64 of the dielectric layer 62 is lower than a top surface 66 of the bit lines 112. In this way, parasitic capacitance can be reduced.

Refer to FIG. 10 together with FIG. 12. According to a preferred embodiment of the present invention, a semiconductor structure with capacitor landing pads includes a substrate 10. At least a capacitor contact plug 56 is disposed on the substrate 10. Numerous capacitor contact plugs 56 are shown in FIG. 12 as an example. A capacitor landing pad 54 contacts and connects to one capacitor contact plug 56. There are numerous capacitor landing pads 54. One of the capacitor landing pads 54 and one of the capacitor contact plugs 56 form a step profile. A bit line 112 is disposed on the substrate 10. A dielectric layer 62 surrounds the capacitor landing pads 54. The dielectric layer 62 has a bottom 64 lower than a top surface 66 of the bit line 112. Moreover, a first distance D1 is disposed between a top surface 68 of the capacitor landing pads 54, and a top surface 70 of the substrate 10. A second distance D2 is disposed between the top surface 66 of the bit line 112 and the top surface 70 of the substrate 70. The first distance D1 is larger than the second distance D2. A bit line mask 72 covers the bit line 112. The top surface 66 of the bit line 112 contacts the bit line mask 72. The bit line mask 72 is disposed between the capacitor landing pads 54 and the bit line 112. The topmost surface of the bit line mask 72 is lower than the topmost surface of each of the capacitor landing pads 54. Moreover, the capacitor landing pads 54 are on the bit line mask 72. The capacitor contact plugs 56 are below the bit line mask 72.

The dielectric layer surrounding the capacitor landing pads has a bottom lower than a top surface of the bit line to reduce parasitic capacitance, and ensure the capacitor landing pads are insulated from each other.

Figure 13:
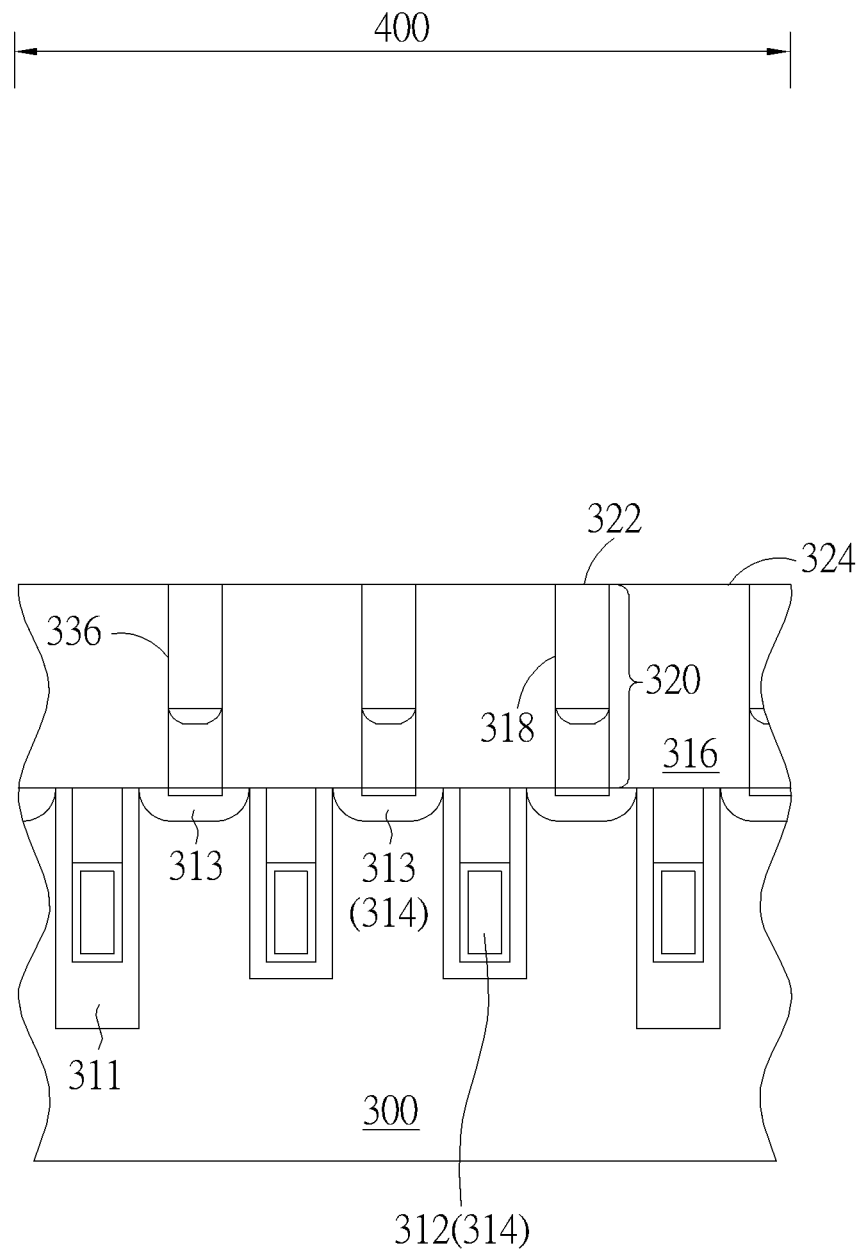

FIG. 13 to FIG. 18 depict a contact structure utilized for electrically connecting a capacitor and a transistor in a DRAM. As shown in FIG. 13, a substrate 300 is provided. The substrate 300 has a memory region 400. Numerous active areas (not shown) and numerous STIs 311 are disposed within the memory region 400. Numerous word lines 12 are embedded in the substrate 300. Several word lines 312 pass the STIs 311. Numerous bit lines (not shown) are disposed on the substrate 300, and each of the bit lines intersects each of the word lines 312. Moreover, a source/drain doping region 313 is disposed between adjacent word lines 312. The source/drain doping region 313 and the word line 312 adjacent to the source/drain doping region 313 form a transistor 314. Next, a first interlayer dielectric 316 is formed on the substrate 300. Then, numerous contact holes 318 are formed in the first interlayer dielectric 316. The source/drain doping region 313 is exposed through each of the contact holes 318. Subsequently, a conductive material is formed to fill in each of the contact holes 38. The conductive material filling in the contact hole 318 serves as a capacitor contact plug 320. The capacitor contact plug 320 electrically connects to the transistor 314 through the source/drain doping region 313. A top surface 322 of the capacitor contact plug 320 is aligned with a top surface 324 of the first dielectric layer 316. The conductive material may be a single-layered material or a multiple-layered material. The conductive material includes doped polysilicon, CoSi, W, Cu or Al. In this embodiment, the conductive material includes polysilicon, CoSi, and W stacked from bottom to top.

Figure 14:
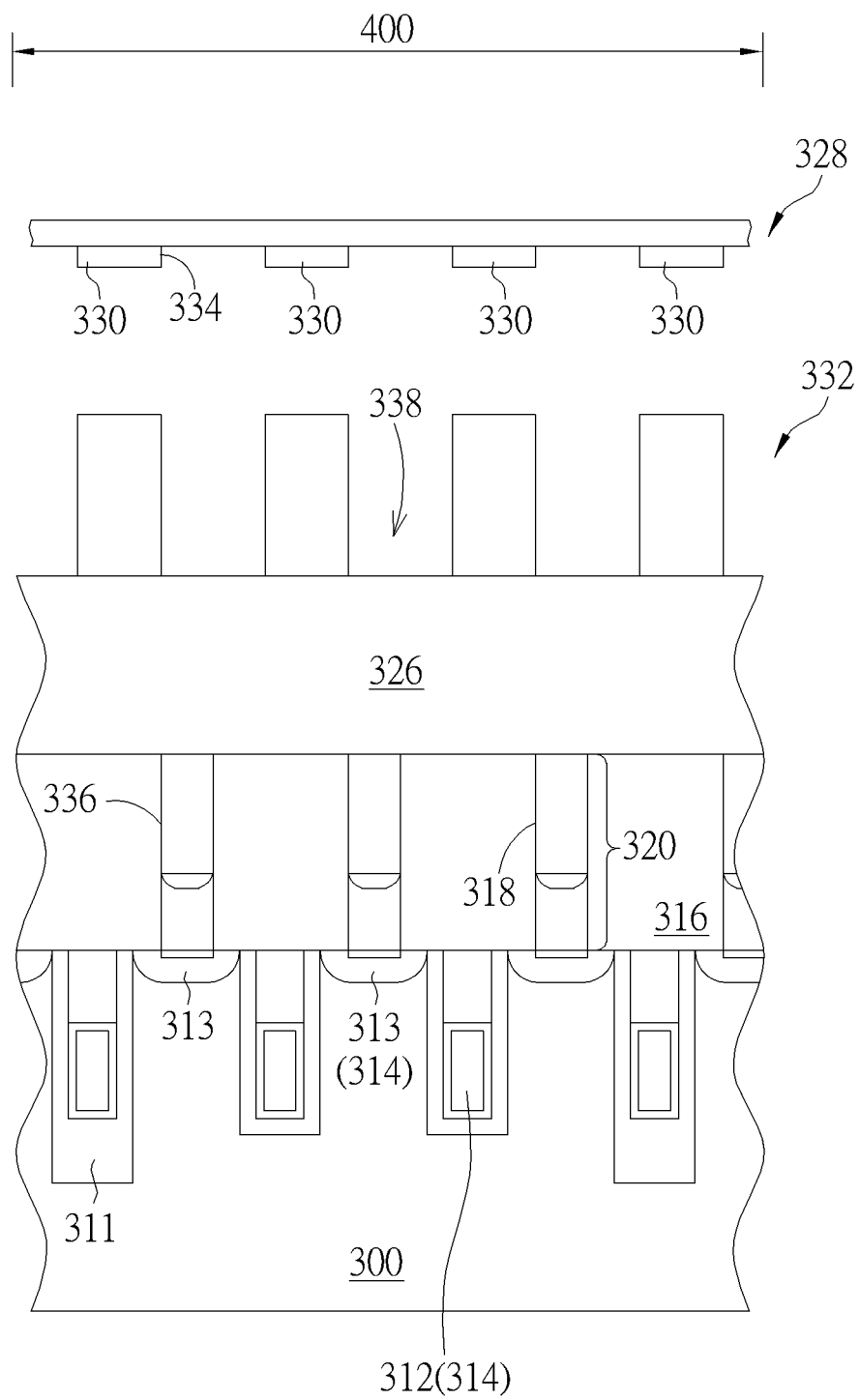

As shown in FIG. 14, a second dielectric layer 326 is formed to cover the first dielectric layer 316. Then, a photoresist is formed on the second dielectric layer 326. Next, a photomask 328 is provided. Numerous pre-determined patterns 330 are formed on the photo mask 328. The pre-determined patterns 330 are used to define a position of initial capacitor landing pads. By using a lithographic process, the pre-determined patterns 330 will be transferred to the photoresist to make the photoresist become a patterned photoresist 332. At this point, the patterned photoresist 332 defines the position of the initial capacitor landing pads on the second dielectric layer 326. In this step, the position of the photo mask 328 is adjusted to make a sidewall 334 of each pre-determined pattern 330 align with a sidewall 336 of the capacitor contact plug 320. Based on this embodiment, the patterned photoresist 332 includes numerous openings 338. The second dielectric layer 326 exposed from the openings 338 will be replaced by the initial capacitor landing pads. The initial capacitor landing pads will hereafter be referred to as capacitor landing pads.

Figure 15:
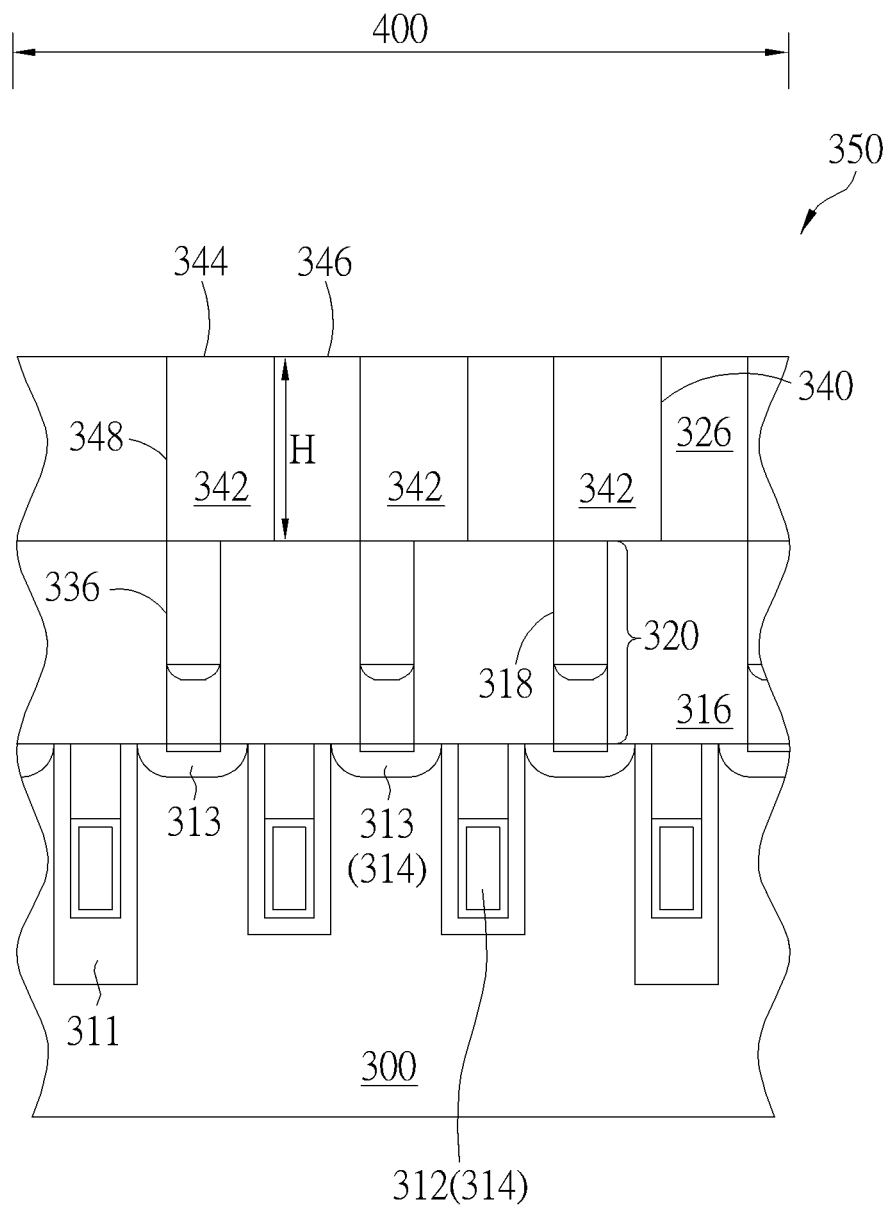

Refer to FIG. 14 together with FIG. 15. The second dielectric layer 326 is etched to form numerous holes 340 in the second dielectric layer 326 by taking the patterned photoresist 332 as an etching mask. Later, the patterned photoresist 332 is removed. Then, a conductive material is formed to fill in each of the holes 340. The conductive material filling in each of the holes 340 serves as initial capacitor landing pads 342. The conductive material is preferably W, but not limited to W. Other suitable conductive materials may be used as initial capacitor landing pads 342. Moreover, a top surface 344 of the initial capacitor landing pads 342 is aligned with a top surface 346 of the second dielectric layer 326. A sidewall 348 of each initial capacitor landing pad 342 is aligned with the sidewall 336 of the capacitor contact plug 320. Each of the initial capacitor landing pads 342 includes a height H. This height H equals a length of the sidewall 348.

Figure 16:
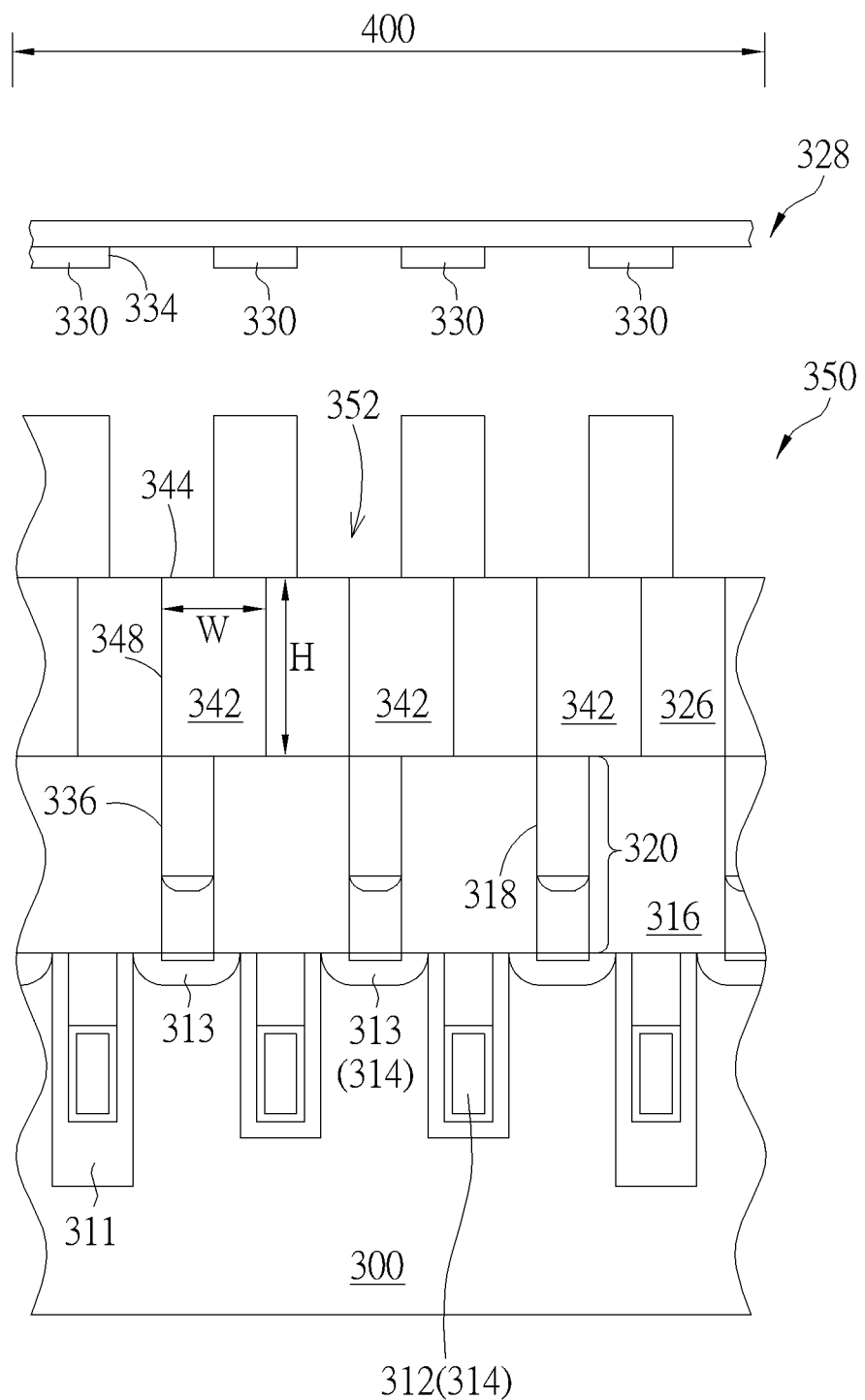

According to another preferred embodiment of the present invention, the capacitor contact plug 320 and the initial capacitor landing pads 342 may be formed simultaneously. For example, numerous contact holes 318 are formed in the first dielectric layer 316 as shown in FIG. 13. Instead of first filling the conductive material, the steps of forming the patterned photoresist 332 and numerous holes 340 in FIG. 14 and FIG. 15 are performed before forming the conductive material. Next, the conductive material is filled into the contact holes 336 and holes 340 to form the capacitor contact plug 320 and the initial capacitor landing pads 342 simultaneously. As shown in FIG. 16, after forming the capacitor contact plug 320 and the initial capacitor landing pads 342, another photoresist is formed to cover the second dielectric layer 326. Then, the photoresist is patterned by using the photo mask 328 via a lithographic process to form a patterned photoresist 350. It should be noted that the photo mask 328 used in this embodiment is the same as the photo mask 328 in FIG. 14. The pre-determined pattern 330 in this embodiment defines the trimming position of the initial capacitor landing pads 342; therefore, the pre-determine pattern 330 overlaps part of the initial capacitor landing pads 342, and the sidewall 334 of the initial capacitor landing pads 342 does not align with the sidewall 336 of the capacitor contact plug 320. The pre-determined pattern 330 in FIG. 14, however, is to define the position of the initial capacitor landing pads 342. Moreover, in this embodiment, the patterned photoresist 350 includes numerous openings 350. Each of the openings 352 corresponds to one initial capacitor landing pad 342. Part of the initial capacitor landing pad 342 is exposed through the opening 352 to which the initial capacitor landing pad 342 corresponds. In detail, a cross-section of the initial capacitor landing pad 342 has a width W. At least one third to two thirds of the width W is exposed through one opening 352. Furthermore, part of the second dielectric layer 326 is exposed through the openings 352. This embodiment takes one half of the width W exposed through one opening 352 as an example.

Figure 17:
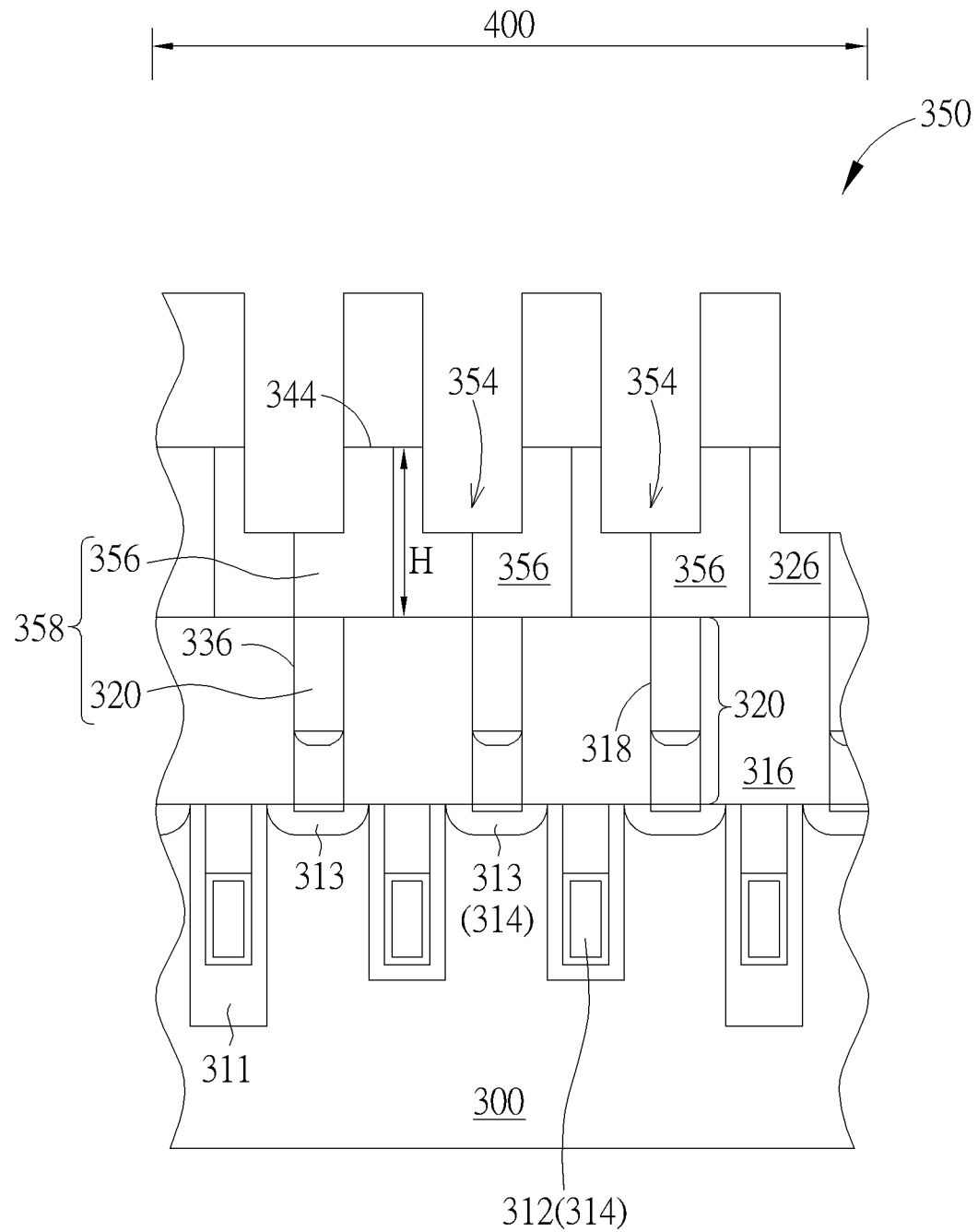

Refer to FIG. 16 together with FIG. 17. The exposed initial capacitor landing pads 342 and the dielectric layer 326 are removed by taking the patterned photoresist 350 as a mask to form numerous holes 354. At this point, at least one third to two thirds (calculated from the top surface 344) of the height H of each of the initial capacitor landing pads 342 is removed. In this embodiment, one half of the height H is removed. At this point, the initial capacitor landing pads 342 become the capacitor landing pads 356. Each of the capacitor landing pads 356 and the capacitor contact plug 320 forms a contact structure 358 of the present invention.

Figure 18:
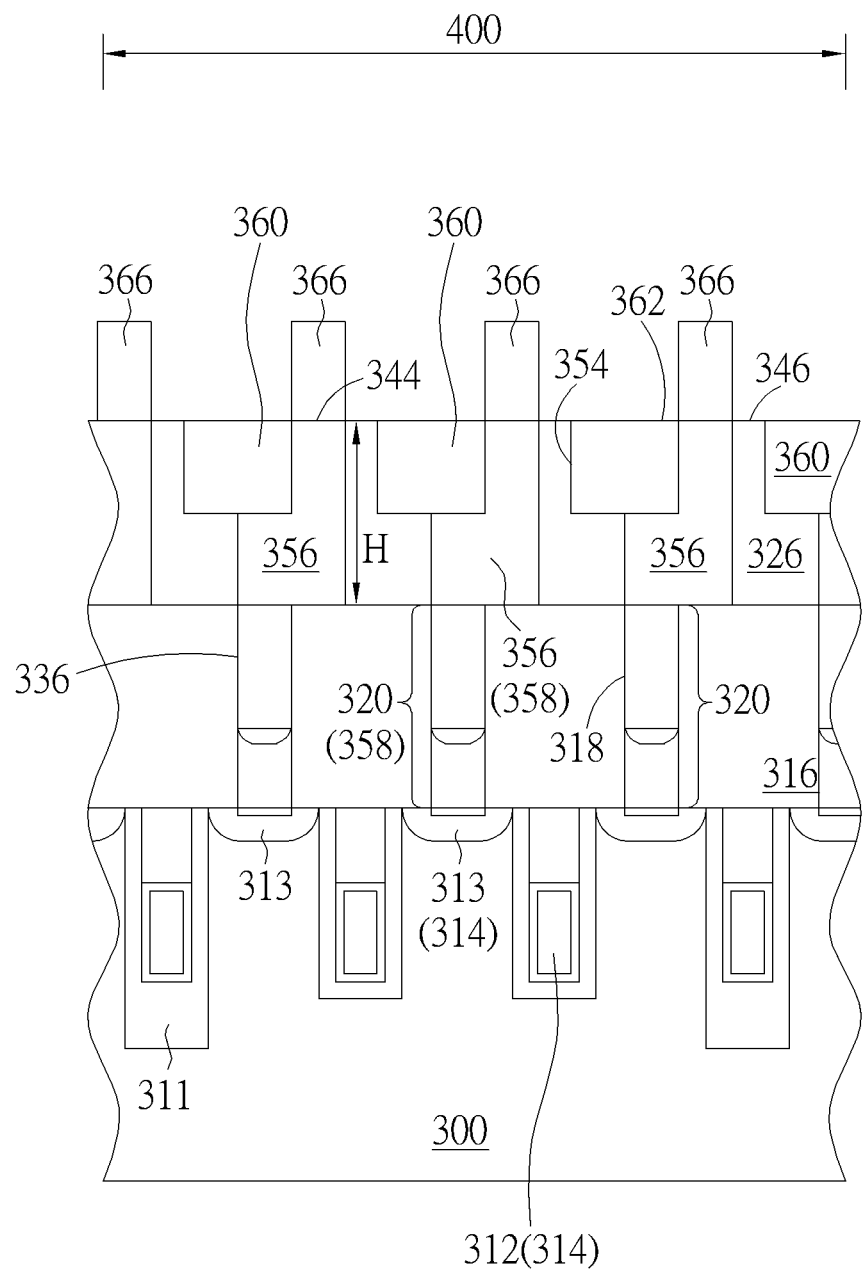

As shown in FIG. 18, the patterned photoresist 350 is removed. Then, a dielectric layer 360 is formed to fill in the holes 350. A top surface 362 of the dielectric layer 360 is aligned with a top surface 346 of the dielectric layer 326. Later, a capacitor 366 is formed to connect and contact one of the capacitor landing pads 356.

Figure 19:
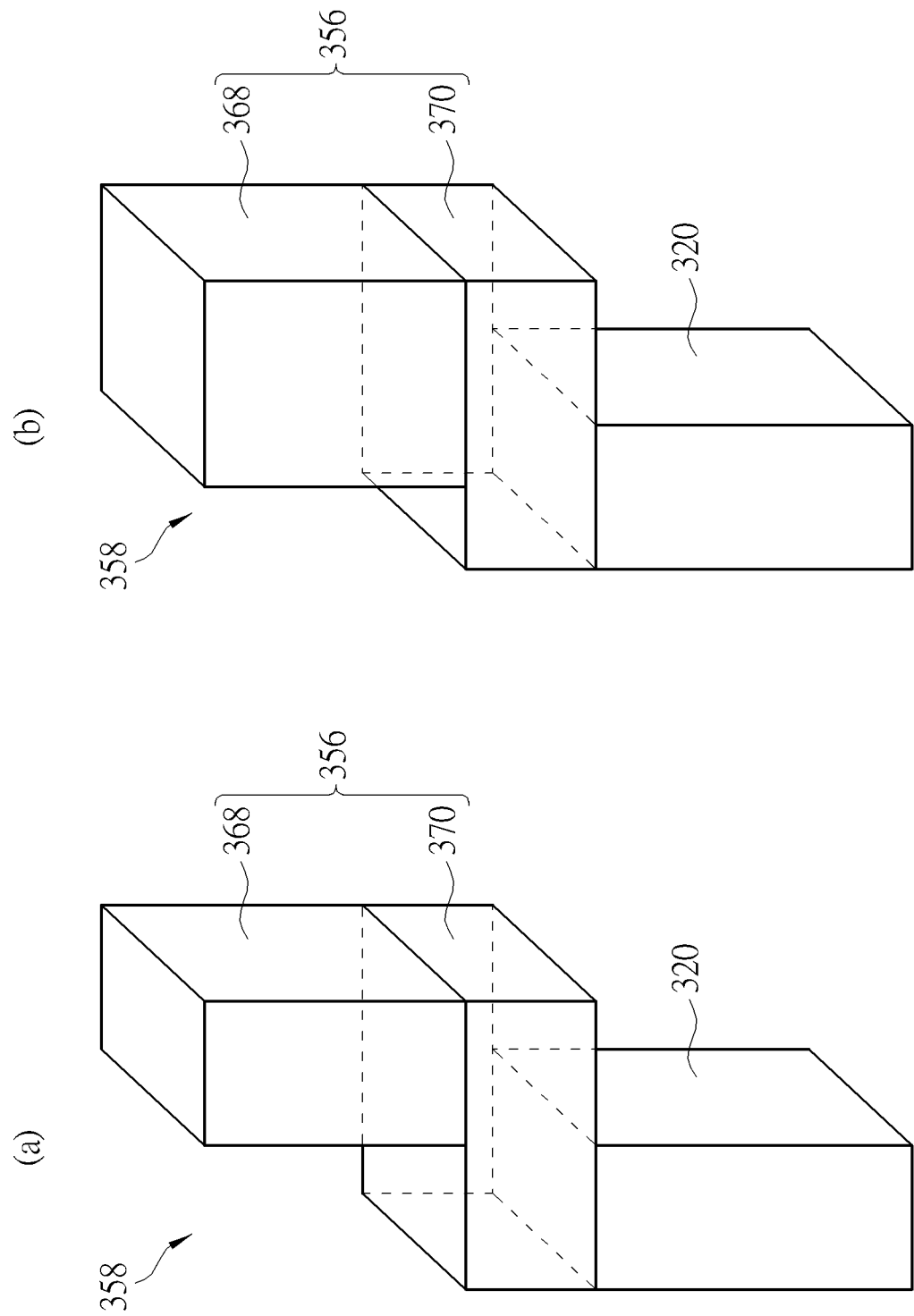
FIG. 19 depicts a three-dimensional contact structure shown in FIG. 18 and a variation of the three-dimensional contact structure shown in FIG. 18.
Figure 20:
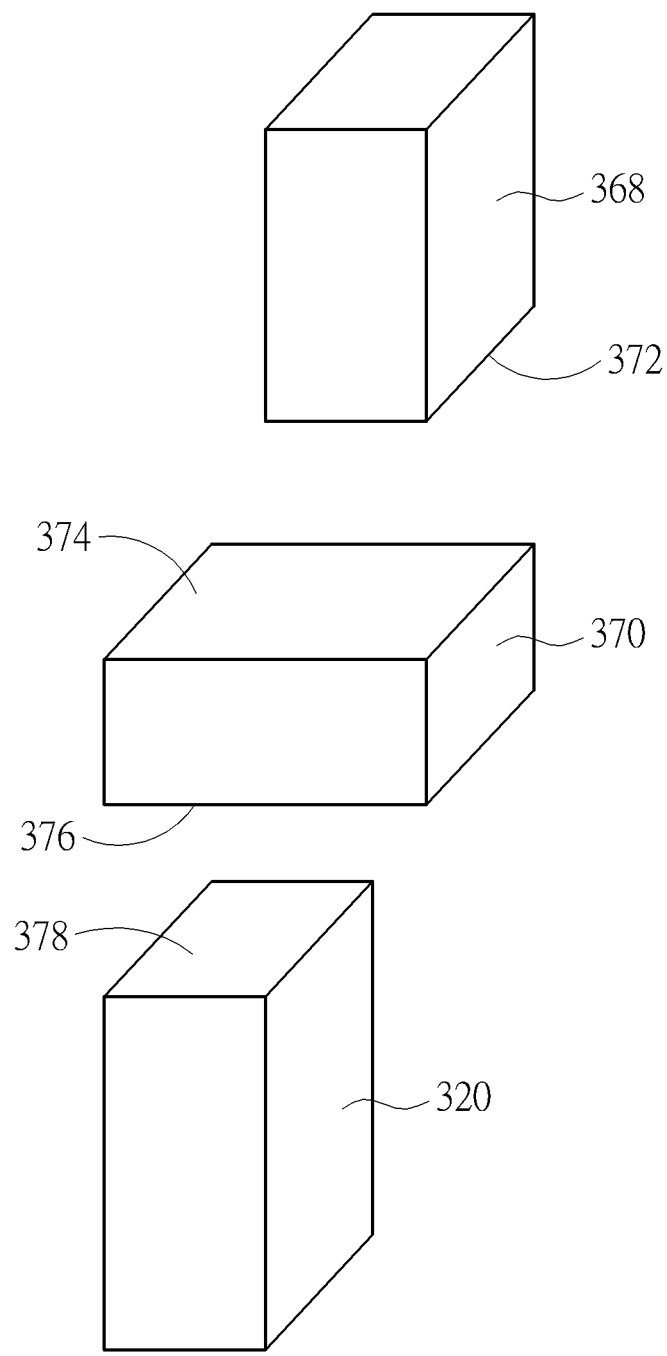
FIG. 20 depicts an exploded view of a three-dimensional contact structure shown in FIG. 19.

An example (a) in FIG. 19 depicts a three-dimensional contact structure shown in FIG. 18. An example (b) in FIG. 19 depicts a variation of the three-dimensional contact structure shown in FIG. 18. FIG. 20 depicts an exploded view of a three-dimensional contact structure shown in the example (a) of FIG. 19. Although only the example (a) is shown in exploded view, an exploded view of the example (b) is almost the same as that of the example (a), except that the area of the first element is different.

As shown in the example (a) in FIG. 19 and FIG. 20, a contact structure 358 includes a capacitor landing pad 356 and a capacitor contact plug 320. The capacitor landing pad 356 includes a first element 368 and a second element 370. The second element 370 is disposed between the first element 368 and the capacitor contact plug 320. The first element 368 includes a first bottom 372. The second element includes a first top surface 374 and a second bottom 376. The first bottom 372 contacts the first top surface 374. The area of the first bottom 372 is smaller than the area of the top surface 374. The capacitor contact plug 320 includes a second top surface 378. The second top surface 378 contacts the second bottom 376. The area of the second top surface 378 is smaller than the area of the second bottom 376. The first element 368 intersects the capacitor contact plug 320. The first bottom 372 does not overlap the second top surface 378. The first top surface 374 is opposite to the second bottom 376. The first top surface 374 has the same shape and the same size as that of the second bottom 376.

The difference between the example (b) and the example (a) is that the second top surface 378 in the example (b) only overlaps part of the first bottom 372. The first bottom 372 in the example (a) does not overlap the second top surface 378. These differences are due to different positions of the photo mask 328.

Part of the capacitor landing pad of the present invention is removed to make the first bottom of the first element smaller than the first top surface of the second element. Therefore, the distance between the capacitor and the first element becomes longer, reducing the possibility of a short circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure with capacitor landing pads, comprising:
   a substrate;
   a capacitor contact plug disposed on the substrate;
   a capacitor landing pad contacting and electrically connecting the capacitor contact plug;
   a bit line disposed on the substrate;
   a bit line mask contacting the bit line; and
   a dielectric layer surrounding the capacitor landing pad, wherein the dielectric layer comprises a bottommost surface lower than a top surface of the bit line, and a topmost surface of the capacitor landing pad and a topmost surface of the dielectric layer are aligned, and a topmost surface of the bit line mask is lower than the topmost surface of the capacitor landing pad.

2. The semiconductor structure with capacitor landing pads of claim 1, wherein a first distance is disposed between the topmost surface of the capacitor landing pad and a top surface of the substrate, a second distance is disposed between the top surface of the bit line and the top surface of the substrate, and the first distance is greater than the second distance.

3. The semiconductor structure with capacitor landing pads of claim 1, wherein the dielectric layer forms a chessboard pattern.

4. The semiconductor structure with capacitor landing pads of claim 1, wherein the bit line mask is between the capacitor landing pad and the bit line.

5. The semiconductor structure with capacitor landing pads of claim 1, wherein the dielectric layer is in a shape of a meat cleaver including a handle and a blade, a topmost surface of the blade is aligned with the topmost surface of the capacitor landing pad, a bottommost surface of the handle is lower than the top surface of the bit line, and the blade is wider than the handle.

* * * * *